United States Patent
Murakami (10) Patent No.: US 11,414,579 B2
(45) Date of Patent: Aug. 16, 2022

(54) SEALING RESIN COMPOSITION

(71) Applicant: TOYOBO CO., LTD., Osaka (JP)

(72) Inventor: Yuki Murakami, Shiga (JP)

(73) Assignee: TOYOBO CO., LTD., Osaka (JP)

( * ) Notice: Subject to any disclaimer, the term of this patent is extended or adjusted under 35 U.S.C. 154(b) by 275 days.

(21) Appl. No.: 16/607,445

(22) PCT Filed: May 17, 2018

(86) PCT No.: PCT/JP2018/019048
§ 371 (c)(1),
(2) Date: Oct. 23, 2019

(87) PCT Pub. No.: WO2018/225471
PCT Pub. Date: Dec. 13, 2018

(65) Prior Publication Data
US 2020/0140731 A1    May 7, 2020

(30) Foreign Application Priority Data
Jun. 9, 2017    (JP) .............................. JP2017-114231

(51) Int. Cl.
| | |
|---|---|
| *C09K 3/10* | (2006.01) |
| *C08G 63/183* | (2006.01) |
| *C08G 63/189* | (2006.01) |
| *C08K 5/29* | (2006.01) |
| *C08L 67/02* | (2006.01) |

(52) U.S. Cl.
CPC .............. *C09K 3/10* (2013.01); *C08G 63/183* (2013.01); *C08G 63/189* (2013.01); *C08K 5/29* (2013.01); *C08L 67/02* (2013.01); *C08L 2201/08* (2013.01); *C08L 2205/03* (2013.01); *C09K 2200/0617* (2013.01); *C09K 2200/0647* (2013.01); *C09K 2200/0655* (2013.01); *C09K 2200/0657* (2013.01)

(58) Field of Classification Search
CPC .............. C09K 3/10; C09K 2200/0617; C09K 2200/0647; C09K 2200/0655; C09K 2200/0657; C08G 63/183; C08G 63/189; C08K 5/29; C08L 67/02; C08L 2201/08; C08L 2205/03
See application file for complete search history.

(56) References Cited

U.S. PATENT DOCUMENTS 6,306,942 B1 * 10/2001 McCarthy .............. C09J 175/06
                                                             524/195
2005/0054755 A1    3/2005 Takahashi et al.
(Continued)

FOREIGN PATENT DOCUMENTS

| CN | 103467935 | * 12/2013 | .............. C08L 67/02 |
| EP | 919363 A1 | * 6/1999 | .............. B32B 15/08 |

(Continued)

OTHER PUBLICATIONS

English machine translation of CN 103467935 (Year: 2013).*
(Continued)

*Primary Examiner* — John E Uselding
(74) *Attorney, Agent, or Firm* — Wenderoth, Lind & Ponack, L.L.P.

(57) ABSTRACT

The present invention provides a sealing resin composition containing a polyester resin (A), carbodiimide (B) and an antioxidant (C).

3 Claims, 1 Drawing Sheet

(56) References Cited

U.S. PATENT DOCUMENTS

| | | | |
|---|---|---|---|
| 2006/0252864 | A1 | 11/2006 | Yoshioka |
| 2009/0176938 | A1* | 7/2009 | Xu .................. C08L 67/04 525/190 |
| 2009/0203871 | A1* | 8/2009 | Maruyama .......... C08G 63/914 528/303 |
| 2013/0139883 | A1 | 6/2013 | Togawa et al. |
| 2013/0331521 | A1* | 12/2013 | Funaoka ............. C08L 23/02 525/166 |
| 2015/0322258 | A1* | 11/2015 | Watanabe ........... C08L 67/025 523/451 |
| 2017/0130046 | A1 | 5/2017 | Ohashi et al. |

FOREIGN PATENT DOCUMENTS

| | | | |
|---|---|---|---|
| JP | 62-074955 | | 4/1987 |
| JP | 62-112652 | | 5/1987 |
| JP | 63-069255 | | 3/1988 |
| JP | 5-117627 | | 5/1993 |
| JP | 08073719 A | * | 3/1996 ............. C08L 67/02 |
| JP | 9-278933 | | 10/1997 |
| JP | 10-025333 | | 1/1998 |
| JP | 11-058604 | | 3/1999 |
| JP | 11-106621 | | 4/1999 |
| JP | 2000-052489 | | 2/2000 |
| JP | 3187511 | | 7/2001 |
| JP | 2002-037983 | | 2/2002 |
| JP | 2004-262969 | | 9/2004 |
| JP | 2005-082642 | | 3/2005 |
| JP | 2007-119645 | | 5/2007 |
| JP | 2012-184373 | | 9/2012 |
| JP | 2015-147838 | | 8/2015 |
| JP | 2015-224258 | | 12/2015 |
| JP | 2016-000814 | | 1/2016 |
| JP | 2016-065252 | | 4/2016 |
| WO | 2012/115065 | | 8/2012 |
| WO | 2015/194583 | | 12/2015 |
| WO | 2015/194584 | | 12/2015 |

OTHER PUBLICATIONS

English machine translation of JP 08-073719A (Year: 1996).*
International Search Report dated Aug. 21, 2018 in International Application No. PCT/JP2018/019048.

* cited by examiner

SEALING RESIN COMPOSITION

TECHNICAL FIELD OF THE INVENTION

The present invention relates to a sealing resin composition. More particularly, it relates to a sealing resin composition which can seal electrical/electronic parts.

BACKGROUND ART

In electrical/electronic parts which have been widely used for automobiles and electric appliances, electrical insulation property thereof to an outside is essential for achieving their intended use. For example, an electric wire is coated with a resin having electrical insulation property. Recently, need for stuffing electrical/electronic parts having complicated shapes into small volume has been rapidly increasing such as in a case of mobile phones. Under such circumstances, various methods have been adopted for achieving the electrical insulation thereof. Particularly when electrical/electronic parts having complicated shapes such as circuit substrate are sealed by a resin which is to become an insulator, a sealing method is demanded which surely follows the shape of the electrical/electronic parts and does not generate any non-filling parts. A thermoplastic resin (hotmelt resin) is a resin which lowers its viscosity only by means of heating and melting whereby sealing is achieved. A sealed body is formed due to solidification just by means of cooling after the sealing. Therefore, the thermoplastic resin exhibits high productivity. In addition, the thermoplastic resin has such an excellent characteristic that, even after a life as a product finishes, recycling of part materials is easy by means of removing the resin by heating and melting. Therefore, the thermoplastic resin is suitable for sealing the electrical/electronic parts. Polyester exhibits both of high electrical insulation property and high water resistance. Therefore, polyester is believed to be a very useful material for such a use.

For the sealed body of electrical/electronic parts, there are some cases wherein durability for a long term is demanded. In the past, improvement in resistance to thermal aging by means of compounding with an antioxidant or the like had been known as to the long-term durability of thermoplastic resin (for example, Patent Document 1). However, in the prior art as such, there is a problem that, in a long-term test under high-temperature and high-humidity conditions, suppression of hydrolysis of polyester is difficult and a long-term reliability of sealing property lowers.

In the Patent Document 2, there is disclosed a polyester resin composition in which a tackifier is compounded in order to guarantee the sealing property whereby adhesive strength is enhanced. Although this composition has a strong adhesive force, there has been a problem that, in the long-term test under high temperature, the resin becomes brittle whereby the long-term reliability of the sealing property lowers.

PRIOR ART DOCUMENTS

Patent Documents

Patent Document 1: Japanese Patent No. 3187511
Patent Document 2: Japanese Patent Application No. 106621/99

DISCLOSURE OF THE INVENTION

Problem that the Invention is to Solve

In the prior art as mentioned above, there has not been proposed any resin composition which fully satisfies the long-term durability or, particularly, demanded properties as a sealing resin composition under high-temperature and high-humidity conditions or high-temperature condition.

The present invention has been achieved under such problems in the prior art as the background. Thus, an object of the present invention is to provide a sealing resin composition being excellent in a long-term durability, in a cooling/heating cycle and in a long-term reliability without causing any decrease in physical properties particularly under high-temperature and high-humidity conditions or high-temperature condition. The sealing resin composition in accordance with the present invention is particularly advantageous for sealing the electrical/electronic parts.

Means for Solving the Problem

As a result of extensive investigations, the inventor of the present invention has found that the above problem can be solved by the following means and has achieved the present invention. Thus, the present invention comprises the following constitutions.

A sealing resin composition containing a polyester resin (A), carbodiimide (B) and an antioxidant (C).

Acid value of the polyester resin (A) is preferred to be 100 equivalents/$10^6$ g or less.

It is preferred that the resin composition further contains epoxy (D).

It is preferred that the resin composition further contains polyolefin (E).

It is preferred that the resin composition further contains a terpene-modified phenol resin (F).

A sealed body which is sealed by the sealing resin composition mentioned in any of the above.

Advantages of the Invention

When the sealing resin composition for the electrical/electronic parts according to the present invention is used as a sealing material in a sealed body of the electrical/electronic parts, it is now possible to prepare a sealed body of the electrical/electronic parts which satisfies the cooling/heating cycle and the long-term durability.

BEST MODE FOR CARRYING OUT THE INVENTION

Figure 1:
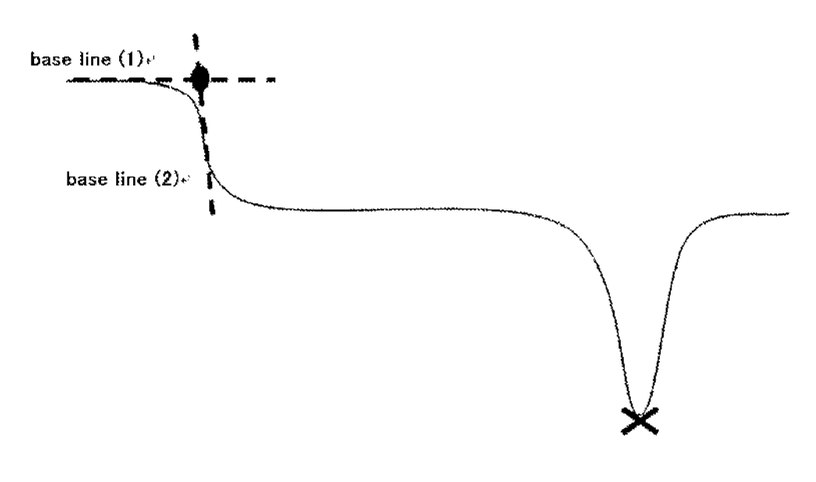
The FIGURE shows a schematic graph of a chart measured by a differential scanning calorimeter.

As hereinafter, the present invention will be mentioned in detail.

<Polyester Resin (A)>

Although the polyester resin (A) used in the present invention is not particularly limited, an example thereof is a polyester resin or a polyester elastomer having a chemical structure obtained from polycondensation of a polycarboxylic acid component and a polyhydric alcohol component, and another example is a polyester resin or a polyester elastomer having a chemical structure wherein a hard segment mainly composed of polyester segment and a soft segment mainly composed of polyalkylene glycol component are bonded by means of an ester bond. Among the above, it is preferred to be composed of the chemical structure wherein the hard segment mainly composed of the polyester segment and the soft segment mainly composed of the polyalkylene glycol component are bonded by means of the ester bond. It is preferred that the above polyester segment is mainly composed of polyester having a structure which can be formed by polycondensation of an aromatic dicarboxylic acid with an aliphatic glycol and/or an alicyclic glycol. The term reading "mainly composed of" used hereinabove means that the polyester having the above structure occupies preferably 90 molar % or more, more preferably 95 molar % or more, and further preferably 100 molar % of the polyester segment. It is preferred that the above soft segment is contained in an amount of 20 molar % or more and 80 molar % or less, more preferably 30 molar % or more and 70 molar % or less, and further preferably 40 molar % or more and 60 molar % or less, to the total amount of the polyester resin (A).

An upper limit of ester group concentration in the polyester resin (A) used in the present invention is desired to be 8000 equivalents/$10^6$ g. The upper limit is preferred to be 7500 equivalents/$10^6$ g and more preferred to be 7000 equivalents/$10^6$ g. When resistance to chemicals (such as gasoline, engine oil, alcohol and commonly used solvents) is demanded, a lower limit is desired to be 1000 equivalents/$10^6$ g. The lower limit is more preferred to be 1500 equivalents/$10^6$ g and further preferred to be 2000 equivalents/$10^6$ g. Hereinabove, a unit of the ester group concentration is expressed in terms of equivalent numbers per $10^6$ g of the resin. It can be calculated from a composition of the polyester resin and a copolymerized ratio thereof.

Acid value of the polyester resin (A) used in the present invention is preferred to be 100 equivalents/$10^6$ g or less, more preferred to be 70 equivalents/$10^6$ g or less, and further preferred to be 50 equivalents/$10^6$ g or less. When the acid value is too high, hydrolysis of the polyester resin (A) may be promoted by an acid which is generated from the carboxylic acid and there may be resulted a decrease in resin strength. Although a lower limit of the acid value is not particularly limited, it is preferred to be 10 equivalents/$10^6$ or more and more preferred to be 20 equivalents/$10^6$ or more. When the acid is too low, adhesive property may lower.

Although a lower limit of number-average molecular weight of the polyester resin (A) used in the present invention is not particularly limited, it is preferred to be 3,000 or more, more preferred to be 5,000 or more, and further preferred to be 7,000 or more. Although an upper limit of the number-average molecular weight is not particularly limited, it is preferred to be 60,000 or less, more preferred to be 50,000 or less, and further preferred to be 40,000 or less. When the number-average molecular weight is too low, resistance to hydrolysis of the sealing resin composition and retention of strength and elongation under high temperature and high humidity may become insufficient while, when the number-average molecular weight is too high, melt viscosity of the sealing resin composition may become too high whereby molding pressure may become too high or molding may become difficult.

Glass transition temperature of the polyester resin (A) used in the present invention is preferred to be −100° C. or higher, more preferred to be −90° C. or higher, and further preferred to be −80° C. or higher. When the glass transition temperature is too low, resistance of the polyester resin (A) to blocking may lower. In addition, an upper limit of the glass transition temperature is preferred to be −10° C. or lower, more preferred to be −20° C. or lower, further preferred to be −40° C. or lower, and especially preferred to be −50° C. or lower. When the glass transition temperature is too high, the long-term durability may lower.

It is preferred that the polyester resin (A) used in the present invention is a saturated polyester resin. It is also preferred that the polyester resin (A) used in the present invention is an unsaturated polyester resin having a vinyl group in an amount of as small as not more than 50 equivalents/$10^6$ g. When it is an unsaturated polyester having a high concentration of the vinyl group, cross-linking may happen upon melting and thus stability upon melting may be inferior.

It is also possible that the polyester resin (A) used in the present invention is copolymerized, if necessary, with a trifunctional or higher polycarboxylic acid or polyol such as trimellitic acid anhydride or trimethylolpropane so as to make into a branched polyester.

In order to conduct the molding without generating thermal deterioration of the polyester resin (A) used in the present invention if at all possible, a quick melting at 210 to 240° C. is demanded. For such a purpose, an upper limit of a melting point of the polyester resin (A) is desired to be 210° C. The upper limit is preferred to be 200° C. and more preferred to be 190° C. When manipulability at ambient temperature and usual heat resistance are taken into consideration, a lower limit of the melting point is 70° C. or higher, preferably 100° C. or higher, more preferably 120° C. or higher, especially preferably 140° C. or higher, and most preferably 150° C. or higher.

As to a method for preparing the polyester resin (A) used in the present invention, known methods may be adopted. For example, polycarboxylic acid component and polyol component which will be mentioned later are subjected to an esterifying reaction at 150 to 250° C. and, after that, polycondensation reaction is carried out at 230 to 300° C. in vacuo whereupon the polyester can be prepared. Alternatively, an ester interchange reaction is conducted at 150° C. to 250° C. using a derivative (such as a dimethyl ester) of the polycarboxylic acid and the polyol component which will be mentioned later and, after that, polycondensation is conducted at 230 to 300° C. together in vacuo whereupon the polyester can be prepared.

<Hard Segment of the Polyester Resin (A)>

It is preferred that the hard segment of the polyester of the present invention is mainly composed of a polyester segment.

Although an acid component constituting the polyester segment is not particularly limited, it is preferred to contain an aromatic dicarboxylic acid having 8 to 14 carbons in such a view that heat resistance of the polyester resin (A) is enhanced. In addition, the aromatic dicarboxylic acid having 8 to 14 carbons is desired to be a terephthalic acid and/or a naphthalene dicarboxylic acid due to high reactivity thereof with glycol and in view of polymerization property and productivity. It is also preferred that a total amount of terephthalic acid and naphthalene dicarboxylic acid occupies 50 molar % or more, more preferably 60 molar % or more, further preferably 80 molar % or more, and especially preferably 95 molar % or more of a total acid component. There is no problem even if the total acid component is constituted from terephthalic acid and/or naphthalene dicarboxylic acid.

As to other acid component constituting the polyester segment, there are exemplified a dicarboxylic acid such as an aromatic dicarboxylic acid (e.g., diphenyl dicarboxylic acid, isophthalic acid and 5-sodium sulfoisophthalate), an alicyclic dicarboxylic acid (e.g., cyclohexanedicarboxylic acid and tetrahydrophthalic acid anhydride) and an aliphatic dicarboxylic acid (such as succinic acid, glutaric acid, adipic acid, azelaic acid, sebacic acid, dodecanedioic acid, dimer acid and hydrogenated dimer acid). Those dicarboxylic acid components are used within such an extent that the melting point of the polyester resin (A) is not greatly lowered thereby. A copolymerizing rate thereof is 40 molar % or less and preferably 20 molar % or less of the total acid component. It is also possible to use trifunctional or higher polycarboxylic acid (such as trimellitic acid and pyromellitic acid) as other acid component constituting the polyester segment. In view of prevention of gelling of the sealing resin composition, a copolymerizing rate of the trifunctional or higher polycarboxylic acid is preferred to be not more than 10 molar % and more preferred to be not more than 5 molar % of the total acid component.

Although there is no particular limitation for an aliphatic glycol and/or an alicyclic glycol constituting the polyester segment, it is preferred to be an alkylene glycol having 2 to 10 carbons and more preferred to be an alkylene glycol having 2 to 8 carbons. It is preferred that the aliphatic glycol and/or the alicyclic glycol occupy/ies 50 molar % or more, and more preferably 70 molar % or more of a total glycol component. As to the preferred glycol component, specific examples thereof include ethylene glycol, 1,3-propylene glycol, 1,4-butanediol, 1,6-hexanediol and 1,4-cyclohexane dimethanol. 1,4-Butanediol and 1,4-cyclohexane dimethanol are most preferred in such a view that they can enhance the heat resistance of the polyester resin (A). Further, as a part of the glycol component, it is possible to use trifunctional or higher polyol such as glycerol, trimethylolpropane and pentaerythritol. A content of such a polyol is preferred to be 10 molar % or less, and more preferred to be 5 molar % or less of the total glycol component in view of the prevention of gelling of the resin composition.

As to the component constituting the polyester segment, that which consists of a butylene terephthalate unit or a butylene naphthalate unit is particularly preferred in such a view that the polyester resin (A) becomes high-melting whereby the resistance to heat can be improved and also in view of molding ability and cost performance.

<Soft Segment of the Polyester Resin (A)>

It is preferred that the soft segment of the polyester resin (A) of the present invention mainly consists of a polyalkylene glycol component. A lower limit of the copolymerizing rate of the soft segment is preferred to be 1 molar % or more, more preferred to be 5 molar % or more, further preferred to be 10 molar % or more, and especially preferred to be 20 molar % or more, when the total glycol component constituting the above polyester resin (A) is taken as 100 molar %. Further, an upper limit is preferred to be 90 molar % or less, more preferred to be 55 molar % or less, further preferred to be 50 molar % or less, and especially preferred to be 45 molar % or less. When the copolymerizing rate of the soft segment is too low, there is a tendency of causing problems such as that melt viscosity of the sealing resin composition of the present invention may become high whereby the molding under low pressure may not be possible or that a crystallizing speed may be fast whereby a shortshot may be resulted. Furthermore, if the copolymerizing rate of the soft segment is too high, there is a tendency of resulting in a problem such as that the heat resistance of the sealed body of the present invention may become insufficient.

Although a lower limit of number-average molecular weight of the soft segment is not particularly limited, it is preferred to be 400 or more and more preferred to be 800 or more. When the number-average molecular weight of the soft segment is too low, flexibility cannot be imparted and thus there is a tendency of causing such a problem that stress loading to the electronic substrate after sealing may become big. Further, an upper limit of the number-average molecular weight of the soft segment is preferred to be 5000 or less and more preferred to be 3000 or less. When the number-average molecular weight is too high, there is a tendency of causing such a problem that compatibility with other copolymerizing component may be bad and copolymerization may not be possible.

As to specific examples of the polyalkylene glycol component used for the soft segment, there are exemplified polyethylene glycol, polytrimethylene glycol and polytetramethylene glycol. In view of imparting the flexibility and lowering the melt viscosity, polytetramethylene glycol is most preferred.

Although the polyester resin (A) of the present invention may be amorphous or crystalline, crystalline polyester resin is more preferred. Using a differential scanning calorimeter (DSC), a polyester resin is once cooled down to −100° C. and then heated up to 300° C. at a speed of 20° C./minute. After that, it is cooled down from 300° C. to −100° C. at a speed of 50° C./minute and then heated again up to 300° C. at a speed of 20° C./minute. The crystalline polyester resin in the present invention stands for such a polyester resin which shows a clear melting peak in any of the above two temperature-rising steps. On the other hand, the amorphous polyester resin stands for such a polyester resin which does not show the melting peak in any of the above two temperature-rising steps.

<Carbodiimide (B)>

The carbodiimide (B) used in the resin composition of the present invention has a structure in which at least one N=C=N bond (s) is/are present in a molecule. As to the carbodiimide (B), there are exemplified N,N'-di-o-toluyl carbodiimide, N,N'-diphenyl carbodiimide, N,N'-di-2,6-dimethylphenyl carbodiimide, N,N'-bis(2,6-diisopropylphenyl) carbodiimide, N,N'-dioctyldecyl carbodiimide, N,N'-di-2,2-di-tert-butylphenyl carbodiimide, N,N'-di-p-nitrophenyl carbodiimide, N,N'-di-p-aminophenyl carbodiimide, N,N'-di-p-hydroxyphenyl carbodiimide, N,N'-dicyclohexyl carbodiimide, N,N'-di-p-toluyl carbodiimide, N,N'-diisopropyl carbodiimide, N-ethyl-N'-(3-dimethylaminopropyl) carbodiimide and N-ethyl-N'-(3-dimethylaminopropyl) carbodiimide hydrochloride.

A lower limit of a compounding amount of the carbodiimide (B) in the present invention to 100 parts by mass of the polyester resin (A) is preferred to be 0.01 part by mass or more, more preferred to be 0.1 part by mass or more, and further preferred to be 0.5 part by mass or more. An upper limit thereof is preferred to be 10 parts by mass or less, and more preferred to be 5 parts by mass or less. When the compounding amount of the carbodiimide (B) is too small, suppression of hydrolysis of the polyester resin (A) may become bad while, when it is too much, gelling may be resulted and sealing of electrical/electronic parts may become difficult.

As a result of compounding the carbodiimide (B) with the sealing resin composition in the present invention, hydrolysis of the polyester resin (A) under high temperature and high humidity for a long period of time can be suppressed. Moreover, reaction of functional groups in the polyester resin (A), the epoxy (D), the terpene-modified phenol resin (F), etc. under high temperature for a long period of time can be suppressed whereby hardening and embrittlement of the resin can be suppressed.

<Antioxidant (C)>

As to the antioxidant used in the present invention, there is no particular limitation so far as it can prevent oxidation of the polyester resin (A). There may be used an antioxidant of a hindered phenol type, an antioxidant of a phosphorus type, an antioxidant of a thioether type, etc. Thus, as to the antioxidant of the hindered phenol type, there are exemplified 1,3,5-tris(3,5-di-t-butyl-4-hydroxybenzyl) isocyanurate, 1,1,3-tri(4-hydroxy-2-methyl-5-t-butylphenyl) butane, 1,1-bis(3-t-butyl-6-methyl-4-hydroxyphenyl) butane, 3,5-bis(1,1-dimethylethyl)-4-hydroxybenzene propanoic acid, pentaerythrityl tetrakis(3,5-di-t-butyl-4-hydroxyphenyl) propionate, 3-(1,1-dimethylethyl)-4-hydroxy-5-methylbenzene propanoic acid, 3,9-bis[1,1-dimethyl-2-[(3-t-butyl-4-hydroxy-5-methylphenyl)propionyoxy]ethyl]-2,4,8,10-tetra-oxaspiro[5.5]undecane and 1,3,5-trimethyl-2,4,6-tris (3',5'-di-t-butyl-4'-hydroxybenzyl) benzene; as to the antioxidant of the phosphorus type, there are exemplified 3,9-bis(p-nonyl-phenoxy)-2,4,8,10-tetraoxa-3,9-diphosphaspiro[5.5]undecane, 3,9-bis(octadecyloxy)-2,4,8,10-tetraoxa-3,9-diphosphaspiro-[5.5]undecane, tri(mononon-ylphenyl) phosphite, triphenoxy phosphine, isodecyl phosphite, isodecylphenyl phosphite, diphenyl 2-ethylhex-ylphosphite, dinonylphenyl bis(nonyl-phenyl) ester phosphorus acid, 1,1,3-tris(2-methyl-4-ditridecyl phosphite-5-t-butylphenyl) butane, tris(2,4-di-t-butylphenyl phosphite), pentaerythritol bis(2,4-di-t-butylphenyl phosphite), 2,2'-methylene bis(4,6-di-t-butylphenyl) 2-ethylhexyl phosphite and bis(2,6-di-t-butyl-4-methylphenyl) pentaerythritol diphosphite; and, as to the antioxidant of the thioether type, there are exemplified 4,4'-thiobis[2-t-butyl-5-methylphenol] bis[3-(dodecylthio) propionate], thiobis[2-(1,1-dimethyl-ethyl)-5-methyl-4,1-phenylene] bis[3-(tetradecylthio) propionate], pentaerythritol tetrakis(3-n-dodecyl thiopropionate), didodecyl 3,3'-thiodipropionate and bis(tridecyl) thiodipropionate. Each of them may be used either solely or jointly.

As a result of compounding of the antioxidant (C) with the sealing resin composition, the long-term durability under high temperature and high humidity can be imparted. A compounding amount of the antioxidant (C) to 100 parts by mass of the polyester resin (A) is preferred to be 0.1 part by mass or more, more preferred to be 0.2 part by mass or more, and further preferred to be 0.5 part by mass or more. When the compounding amount is too small, it may exert a bad influence on the long-term durability under high temperature and high humidity. The compounding amount of the antioxidant (C) is preferred to be 5 parts by mass or less, more preferred to be 3 parts by mass or less, and further preferred to be 1 part by mass or less. When the compounding amount is too much, it may exert a bad influence on the adhesive property and flame-retarding property.

<Epoxy (D)>

The epoxy (D) used in the present invention is not particularly limited provided that it is a compound having one or more epoxy group(s) in a molecule. Preferably, the epoxy (D) is a resin having number-average molecular weight within a range of 450 to 40,000 and having 1.1 or more epoxy groups on the average in a molecule. Examples thereof are a glycidyl ether type such as bisphenol A diglycidyl ether, bisphenol S diglycidyl ether, novolak glycidyl ether and brominated bisphenol A diglycidyl ether; a glycidyl ester type such as glycidyl hexahydrophthalate and glycidyl ester of dimer acid; a glycidyl amine type such as triglycidyl isocyanurate, glycidyl hydantoin, tetraglycidyl diaminodiphenylmethane, triglycidyl p-aminophenol, triglycidyl m-aminophenol, diglycidylaniline, diglycidyltoluidine, tetraglycidyl m-xylenediamine, diglycidyl tribromoaniline and tetraglycidyl bisaminomethylcyclohexane; and an alicyclic or aliphatic epoxide type such as 3,4-epoxycyclohexylmethyl carboxylate, epoxydized polybutadiene and epoxydized soybean oil. Each of them may be used either solely or jointly using two or more thereof.

A lower limit of the number-average molecular weight of the epoxy (D) is preferred to be 450 or more, more preferred to be 600 or more, and further preferred to be 1000 or more. When the number-average molecular weight is too small, the sealing resin composition is apt to become soft and the mechanical properties may lower. An upper limit thereof is preferred to be 40,000 or less, more preferred to be 30,000 or less, and further preferred to be 20,000 or less. When the number-average molecular weight is too high, compatibility with the polyester resin (A) lowers whereby tightly adhering property may be deteriorated.

When the epoxy (D) is compounded with the sealing resin composition in the present invention, it is now possible in the sealing of electric/electronic parts to impart excellent characteristics such as good initial tight adhesion and durability of the tight adhesion to a cooling/heating cycle and to a loading of high-humidity and high-temperature environment. It is likely that the epoxy (D) achieves an effect of stress relaxation by retardation of crystallization of the polyester resin (A), an effect as a compatibility accelerator for the polyester resin (A) and polyolefin (E), and an effect of improving wettability to a substrate by introduction of a functional group. A compounding amount of the epoxy (D) in the present invention to 100 parts by mass of the polyester resin (A) is preferred to be 0.1 part by mass or more, more preferred to be 1 part by mass or more, and further preferred to be 5 parts by mass or more. When the compounding amount of the epoxy (D) is less than 0.1 part by mass, the effect of stress relaxation by retardation of crystallization of the polyester resin (A) may not be achieved and also the action as the compatibility accelerator for the polyester resin (A) and polyolefin (E) may not be expressed. The compounding amount is preferred to be 50 parts by mass or less, more preferred to be 40 parts by mass or less, and further preferred to be 30 parts by mass or less. When the epoxy (D) is compounded in 50 parts by mass or more, productivity of the sealing resin composition may be inferior and, moreover, characteristics of the sealed body such as heat resistance may be inferior.

<Polyolefin (E)>

Although the polyolefin (E) used in the present invention is not particularly limited, it is preferred to be a binarily or more highly copolymerized polyolefin. Examples thereof include a copolymer of ethylene with vinyl acetate, a copolymer of ethylene with ethyl acrylate, a ternary copolymer of ethylene with vinyl acetate and maleic anhydride, a ternary copolymer of ethylene with ethyl acrylate and maleic anhydride, a copolymer of ethylene with glycidyl methacrylate, a ternary copolymer of ethylene with vinyl acetate and glycidyl methacrylate and a ternary copolymer of ethylene with ethyl acrylate and glycidyl methacrylate. Density of the polyolefin (E) is preferred to be 0.75 g/cm$^3$ or more, and more preferred to be 0.80 g/cm$^3$ or more. It is preferred to be 0.91 g/cm$^3$ or less, and more preferred to be 0.90 g/cm$^3$ or less. When the binarily or more highly copolymerized polyolefin having low density as such is used as the polyolefin (E), the polyolefin (E) can be easily fine-dispersed and mixed with the polyester resin (A) which is inherently non-compatible with polyolefin, and further a homogeneous sealing resin composition can be prepared using a common biaxial extruder. In addition, as a result of the use of the binarily or more highly copolymerized copolymer having low density as the polyolefin (E), relaxation of residual stress with elapse of time resulted in the polyester resin (A) upon injection molding can be appropriately treated. Accordingly, it is now possible to achieve such preferred properties that impartation of the long-term durability to the adhesive property to the sealing resin composition and reduction of the stress generated by environmental loading. As to the polyolefin (E) having the characteristics as such, polyethylene and ethylene copolymer are particularly preferred in such a respect that they are easily available and at low cost and that they do not have any bad influence to the adhesive property to metal and film. To be more specific, a copolymer of ethylene with α-olefin is most preferred.

Incidentally, as to the polyolefin (E), that which contains no polar group such as carboxyl group and glycidyl group is preferred. When a polar group is present, it may happen that the compatibility with the polyester resin (A) changes and strain energy upon crystallization of the polyester resin (A) may not be relaxed. Generally speaking, a polyolefin having a polar group tends to have high compatibility with polyester resin as compared with a polyolefin having no polar group. However, in the present invention, there is a tendency that a decrease in the adhesive property with elapse of time becomes rather big when the compatibility becomes high.

Further, in the polyolefin (E) used in the present invention, its melt mass flow rate (hereinafter, it will be sometimes abbreviated as MFR) is preferred to be 3 to 20 g/10 minutes. The MFR is measured according to JIS K 7210-1:2014 (test temperature: 190° C.; nominal load: 2.16 kg). When the MFR is less than 3, the melt viscosity may be too high whereby the compatibility with the polyester resin (A) may lower and the adhesive property may be deteriorated. When the MFR is more than 20, the viscosity may be low and the sealing resin composition may very easily become soft whereby the mechanical properties may be inferior.

When the polyolefin (E) is compounded with the sealing resin composition in the present invention, excellent characteristics such as good initial adhesive property can be achieved in the sealing of the electrical/electronic parts. It is likely that the polyolefin (E) plays a relaxation effect for the strain energy due to crystallization of the polyester resin (A) and to relaxation of enthalpy. Particularly when the binary or more highly copolymerized polyolefin is used, it is likely to be possible to impart the flexibility which cannot be achieved by a single polymer whereby the effect is promoted. A compounding amount of the polyolefin (E) in the present invention to 100 parts by mass of the polyester resin (A) is preferred to be 20 parts by mass or more, more preferred to be 30 parts by mass or more, and further preferred to be 40 parts by mass or more. The compounding amount of the polyolefin (E) is preferred to be 70 parts by mass or less, and more preferred to be 60 parts by mass or less. When the compounding amount of the polyolefin (E) is too small, the relaxation of the strain energy due to the crystallization of the polyester resin (A) and to the relaxation of enthalpy are difficult whereby the adhesive strength tends to lower. When the compounding amount of the polyolefin (E) is too much, the adhesive property and the resin property also tend to lower and, further, the polyester resin (A) and the polyolefin (E) cause a macroscopic phase-separation so that elongation at break lowers and flat and smooth surface cannot be obtained whereby a bad influence may be resulted in the molding property.

<Terpene-Modified Phenol Resin (F)>

With regard to the terpene-modified phenol resin (F) used in the present invention, there is no particularly limitation therefor provided that it is a phenol resin which is modified with terpene. The terpene-modified phenol resin may also be a hydrogenated terpene-modified phenol resin wherein the terpene-modified phenol resin is subjected to a hydrogenation treatment.

As to the terpene-modified phenol resin (F), examples thereof are a terpene-modified phenol resin prepared by the reaction of α-pinene with phenol and a hydrogenated terpene-modified phenol resin prepared by a hydrogenation treatment thereof, a terpene-modified phenol resin prepared by the reaction of β-pinene with phenol and a hydrogenated terpene-modified phenol resin prepared by a hydrogenation treatment thereof, and a terpene-modified phenol resin prepared by the reaction of dipentene with phenol and a hydrogenated terpene-modified phenol resin prepared by a hydrogenation treatment thereof.

In the present invention, when the terpene-modified phenol resin (F) is compounded with the sealing resin composition, it is possible to impart a good adhesive property in the sealing of the electrical/electronic parts. It is likely that the terpene-modified phenol resin (F) achieves an effect of the stress relaxation by retardation of crystallization of the polyester resin (A), an effect as a dispersing aid for the polyester resin (A) and polyolefin (F), and an effect of improving the wettability to a substrate by the introduction of a functional group. A compounding amount of the terpene-modified phenol resin (F) in the present invention to 100 parts by mass of the polyester resin (A) is preferred to be 20 parts by mass or more, more preferred to be 30 parts by mass or more, and further preferred to be 40 parts by mass or more. The compounding amount of the terpene-modified phenol resin (F) is preferred to be 70 parts by mass or less, and more preferred to be 60 parts by mass or less. When the compounding amount of the terpene-modified phenol resin (F) is too small, the effect of stress relaxation by the retardation of crystallization may not be achieved and also the action as the dispersing aid for the polyester resin (A) and the polyolefin (E) may not be expressed. When the compounding amount of the terpene-modified phenol resin (F) is too much, the flexibility of the resin may lower in accordance with a rise in elastic modulus, which leads to a bad effect for the adhesive property, or a functional group of the terpene-modified resin (F) may react with a compounded thing whereby the resin may become brittle.

<Sealing Resin Composition>

The sealing resin composition of the present invention is a composition which at least contains the above polyester resin (A), carbodiimide (B) and antioxidant (C), and further contains the above epoxy (D), polyolefin (E) and/or terpene-modified phenol resin (F) upon necessity. Here, the term reading "sealing" means that precision parts or the like are wrapped without gap so as not to contact with surrounding air, for preventing dust and water. The sealing resin composition of the present invention is excellent in the long-term reliability whereby it is suitable for a sealing use particularly for the electrical/electronic parts among the precision parts.

There is no problem at all even if the sealing resin composition of the present invention is compounded with other resin (such as polyester, polyamide, polyolefin, polycarbonate, acryl, ethylene vinyl acetate or epoxy) which is not corresponding to any of the polyester resin (A), the carbodiimide (B), the antioxidant (C), the epoxy (D), the polyolefin (E) and the terpene-modified phenol resin (F) of the present invention, a curing agent (such as isocyanate compound or melamine), a bulking agent (such as talc or mica), a pigment (such as carbon black or titanium oxide) and a flame-retarding agent (such as antimony trioxide or brominated polystyrene) within such an extent that they do not deteriorate the effect of the present invention. When those components are compounded, the adhesive property, flexibility, durability, etc. may be improved. It is preferred that the polyester resin (A) at that time occupies 50% by mass or more, more preferably 60% by mass or more, and further preferably 70% by mass or more of the total resin composition of the present invention. When the content of the polyester resin (A) is less than 50% by mass, there is such a tendency that excellent adhesive property to the electrical/electronic parts, durability of the adhesion, retention of elongation, resistance to hydrolysis, water resistance, etc. inherent to the polyester resin (A) itself may lower.

In addition, when the sealing resin composition of the present invention is demanded to be weather-resisting, it is preferred that a light stabilizer is added thereto. As to the light stabilizer, there are exemplified a benzotriazole-type light stabilizer, a benzophenone-type light stabilizer, a hindered amine-type light stabilizer, a nickel-type light stabilizer and a benzoate-type light stabilizer. As to the benzotriazole-type light stabilizer, there are exemplified 2-(3,5-di-tert-amyl-2'-hydroxyphenyl)benzotriazole, 2-(2-hydroxy-5-tert-octylphenyl)benzotriazole, 2-(2'-hydroxy-3'-tert-butyl-5'-methylphenyl)-5-chlorobenzotriazole, 2-(2H-benzotriazole-2-yl)-p-cresol, 2-(2'-hydroxy-5'-methylphenyl)-benzotriazole, 2,4-di-tert-butyl-6-(5-chlorobenzotriazol-2-yl)phenol and 2-[2-hydroxy-3,5-di(1,1-dimethylbenzyl)]-2H-benzotriazole. As to the benzophenone-type light stabilizer, there are exemplified 2-hydroxy-4-(octyloxy)benzophenone, 2,4-dihydroxybenzophenone, 2-hydroxy-4-methoxybenzophenone, 2-hydroxy-4-methoxybenzophenone, 2-hydroxy-4-methoxybenzophenone-5-sulfonic acid, 2-hydroxy-4-n-dodecyloxybenzophenone, bis(5-benzoyl-4-hydroxy-2-methoxyphenyl)methane, 2,2'-dihydroxy-4-methoxybenzophenone and 2,2'-dihydroxy-4,4'-dimethoxybenzophenone. As to the hindered amine-type light stabilizer, there are exemplified bis(2,2,6,6-tetramethyl-4-piperidyl) sebacate, a polycondensate of dimethyl succinate with 1-(2-hydroxyethyl)-4-hydroxyl-2,2,6,6-tetramethylpiperidine, poly[{6-(1,1,3,3-tetramethylbutyl)amino-1,3,5-triazin-2,4-diyl}{(2,2,6,6-tetramethyl-4-piperidyl)imino}hexamethylene (2,2,6,6-tetramethyl-4-piperidyl)iminol], 1,3,5-tris(3,5-di-tert-butyl-4-hydroxybenzyl)-s-triazin-2,4,6(1H,3H,5H)-trione and tris(4-tert-butyl-3-hydroxy-2,6-dimethylbenzyl)-s-triazin-2,4,6-(1H,3H,5H)-trione. As to the nickel-type light stabilizer, there are exemplified [2,2'-thiobis(4-tert-octylphenolate)]-2-ethylhexylamine-nickel-(II), nickel dibutyldithiocarbamate and [2,2'-thio-bis(4-tert-octylphenolate)] n-butylamin-nickel. As to the benzoate-type light stabilizer, there is exemplified 2,4-di-tert-butylphenyl-3,5'-di-tert-butyl-4'-hydroxy-benzoate. Each of those light stabilizers may be used either solely or jointly. An adding amount in the case of addition is preferred to be 0.1% by mass or more and 5% by mass less to the total sealing resin composition. When the amount is less than 0.1% by mass, the weather-resisting effect may become poor. When the amount is more than 5% by mass, bad influence may be exerted on the adhesive property, the flame-retarding property, etc.

As to a method for determining a composition and a composition ratio of the polyester resin (A), there are exemplified $^1$H-NMR or $^{13}$C-NMR wherein the polyester resin (A) is dissolved in a solvent such as heavy chloroform, and a quantitative determination by gas chromatography measured after methanolysis of the polyester resin (A) (hereinafter, it will be sometimes referred to as a methanolysis-GC method). In the present invention, the composition and the composition ratio shall be determined by the $^1$H-NMR when there is a solvent which can dissolve the polyester resin (A) and is also suitable for the $^1$H-NMR measurement. When there is no suitable solvent or when the composition ratio cannot be specified only by means of the $^1$H-NMR measurement, the $^{13}$C-NMR or the methanolysis-GC method shall be adopted or used together therewith.

It is desired that the melt viscosity of the sealing resin composition of the present invention at 220° C. is from 5 to 2000 dPa·s. The melt viscosity within such a range can be achieved by an appropriate adjustment of the type and the compounding rate of the polyester resin (A), the carbodiimide (B), the antioxidant (C), the epoxy (D), the polyolefin (E) and the terpene-modified phenol resin (F). For example, when the copolymerizing ratio of the polyether-diol to be copolymerized with the polyester resin (A) is increased or when the molecular weight of the polyester resin (A) is decreased, it tends to act in lowering the melt viscosity of the resin composition of the present invention while, when the molecular weight of the polyester resin (A) is increased, it tends to act in increasing the melt viscosity of the resin composition of the present invention. Incidentally, the melt viscosity at 220° C. mentioned herein is a value measured by the following manner. Thus, the sealing resin composition is dried so as to make a water content thereof 0.1% or less, then it is stabilized by heating at 220° C. using a flow tester (Catalog No. CFT-500C) manufactured by Shimadzu, and then the stabilized one is passed through a die in 10 mm thickness having 1.0 mm pore size with a pressure of 98 N/cm$^2$. A measured value measured at that time is adopted as the melt viscosity. When the melt viscosity is as high as exceeding 2000 dPa·s, high resin-cohesive force and durability are achieved but, in a case of sealing the parts having a complicated shape, a high-pressure injection molding is needed whereby destruction of the parts may happen. As a result of the use of a sealing resin composition having the melt viscosity of 1500 dPa·s or less, and preferably 1000 dPa·s or less, a sealed body (molded parts) exhibiting excellent electrical insulation property can be obtained and, at the same time, the characteristic properties of the electrical/electronic parts are not deteriorated as well. Incidentally, in view of an injection operation of the sealing resin composition, the melt viscosity at 220° C. is preferred to be low but, when the adhesive property and cohesive force of the resin composition are taken into consideration, the lower limit is preferred to be 5 dPa·s or more, more preferred to be 10 dPa·s or more, further preferred to be 30 dPa·s or more, and most preferred to be 50 dPa·s or more.

In addition, in order to conduct the molding without generating thermal deterioration of the polyester resin (A) if at all possible, a quick melting at 210 to 240° C. is demanded. Accordingly, an upper limit of a melting point of the polyester resin (A) is desired to be 210° C. The upper limit is preferred to be 200° C. and more preferred to be 190° C. A lower limit is preferred to be 70° C., more preferred to be 100° C., further preferred to be 120° C., especially preferred to be 140° C., and most preferred to be 150° C. It is recommended that the melting point of the polyester resin (A) is set higher to an extent of 5 to 10° C. than a heat-resisting temperature requested in a corresponding use.

In the present invention, the adhesive strength between a specific member and the sealing resin composition is judged by such a method that a test piece for measurement wherein the sealing resin composition is arranged between two plate members for adhesion is prepared by means of molding and then a shear bond strength of this test piece is measured. The method for preparing the test piece for the measurement and the method for measuring the shear bond strength shall be conducted in accordance with the methods mentioned in the Examples shown later.

The sealing resin composition of the present invention is molded by being injected into a metal mold in which the electrical/electronic parts are set. To be more specific, in such a case wherein a screw-type applicator for hot-melt molding process is used, the sealing resin composition is heated and melted at about 160 to 280° C. followed by being injected into the metal mold via an injection nozzle and, after a predetermined cooling time, the molded product is taken out from the metal mold whereby the molded product can be obtained.

There is no particular limitation for the type of the applicator for hot-melt molding process and examples thereof are ST2 manufactured by Nordson and IMC-18F9 (a vertical extrusion molding machine) manufactured by Imoto Seisakusho.

EXAMPLES

The present invention will now be more specifically illustrated by way of Examples and Comparative Examples although the present invention is never limited to those Examples. Incidentally, each of the measured values mentioned in Examples and Comparative Examples was measured by the following methods.

<Measurement of Melting Point and Glass Transition Temperature>

A differential scanning calorimeter (DSC 220 type) manufactured by Seiko Electronic Industry was used and 5 mg of a sample for the measurement was placed in an aluminum pan, tightly sealed by pressing a cover and once held at 250° C. for 5 minutes. After that, quick cooling was done using liquid nitrogen. Then, the measurement was conducted under a temperature-rising rate of 20° C./minute from −150° C. to 250° C. In the resulting curve, a crossing point of a tangent (1) obtained form a base line before an inflection point of a part wherein the inflection point appears in DDSC as shown in The FIGURE with a tangent (2) obtained from the base line after the inflection point was adopted as the glass transition temperature, and the minimum point (marked "x" in the drawing) of an endothermic peak was adopted as the melting point.

<Acid Value>

A sample (0.1 g) of the polyester resin (A) was precisely weighed and dissolved by heating in 10 ml of benzyl alcohol. After that, the acid value was determined by means of titration using a solution of 0.1N NaOH in methanol/benzyl alcohol (in 1/9 ratio by volume). Phenolphthalein was used as an indicator.

<Melting Property (Fluidity) Test>

Method for the evaluation of melt viscosity of the polyester resin (A) and the sealing resin composition A flow tester (CFT-500C type) manufactured by Shimadzu was used and the polyester resin (A) or the sealing resin composition dried to an extent of water content of 0.1% or less was filled in a cylinder at a center of a heated body set at 220° C. After 10 minutes from the filling, weight was applied to the sample via a plunger, and the melted sample was pushed out with a pressure of 1 MPa from a die (pore size: 1.0 mm; thickness: 10 mm) from a bottom of the cylinder. A descending distance and a descending time of the plunger were recorded to calculate the melt viscosity.

<Adhesive Property Test (Shear Bond Strength)>

Method for Preparing a Test Piece for the Shear Bond Strength

The substrate was cut into a size of 70 mm×25 mm and a size of 40 mm×25 mm to prepare two pieces of the substrate. Surfaces thereof were wiped with acetone to remove oil. After that, the two pieces of the substrate were fixed to an inner part of a metal mold for shear bond test in such a manner that a glass epoxy surface or PBT surface of each piece of the substrate contacts with the melted sealing resin composition, that the two pieces of the substrates were overlapped with each other to an extent of 10 mm length, and that a width was set 25 mm and a thickness of the sealing resin composition to be molded was set 1 mm. Then, the sealing resin composition wherein water content thereof was reduced to 0.1% or less was injected using a screw-type applicator for hot-melt molding process (IMC-18F9 which was a vertical low-pressure extrusion molding machine manufacture by Imoto Seisakusho) to conduct the molding. Molding condition was set as follows. Thus, a molding resin temperature was 220° C., a molding pressure was 3.5 MPa, a pressure-keeping pressure was 3.5 MPa, a pressure-keeping time was 20 seconds and a discharge rotation was set at 80% (compared with the maximum discharge of 100%). The molded product was detached from the metal mold to give a test piece for the shear bond strength (substrate/sealing resin composition layer/substrate) wherein the molded resin composition was sandwiched by each of the substrates.

Test Method for Shear Bond Strength

The above test piece for shear bond strength was stored for one day under an atmosphere of 23° C. in a relative humidity of 50%. Then, each substrate was held between chucks using an autograph (AG-IS manufactured by Shimadzu) and the resin composition was detached in a shear direction to measure an initial shear bond strength. A tensile velocity was set to be 50 mm/minute.

Regarding a shear bond strength after a long-term test, a test was conducted under each of the following three types of a long-term test atmosphere: an atmosphere of 105° C.; an atmosphere of 85° C. temperature and 85% relative humidity; and an atmosphere of reciprocation between −40° C. and 105° C. (retention time at each temperature: 30 minutes; cycle frequency: 2000 times). After that, the shear bond strength after the long-term test was evaluated by the above-mentioned test method for shear bond strength.

Evaluating Standards

✳: The shear bond strength was 3 MPa or more

⊙⊙: The shear bond strength was 2 MPa or more and less than 3 MPa

○: The shear bond strength was 1 MPa or more and less than 2 MPa

Δ: The shear bond strength was 0.5 MPa or more and less than 1 MPa x: The shear bond strength was less than 0.5 MPa As to the substrate (a material to be adhered), the following two types were used.

Glass epoxy (GE) substrate plate without resist: FR-4 manufactured by Nikkan Kogyo PBT substrate plate: Polybutylene terephthalate (GF 30%), Duranex 3300 manufactured by Polyplastic <Mechanical Characteristics (Retention Rate for Tensile Elongation)>

A flat plate made of the sealing resin composition in 100 mm×100 mm×2 mm was prepared by injection molding using a vertical injection molding machine (TH40E manufactured by Nissei Jushi).

Injection molding condition was set as follows. Thus, a molding resin temperature was 170° C., a molding pressure was 25 MPa, a cooling time was 20 seconds and an injection velocity was 25 mm/minute. From the molded flat plate were cut No. 3 dumbbells (test pieces No. 3 in a dumbbell shape) for three pieces by using a cutter in accordance with JIS K6251: 2017. The No. 3 dumbbells were held using an autograph (AG-IS manufactured by Shimadzu) with a gap between chucks of 20 mm and the mechanical characteristics were measured. A tensile velocity was set to be 500 mm/minute.

Regarding mechanical characteristics after a long-term test, a test was conducted under each of the following three types of a long-term test atmosphere: an atmosphere of 105° C.; an atmosphere of 85° C. temperature and 85% relative humidity; and an atmosphere of reciprocation between −40° C. and 105° C. (one cycle at each temperature was 30 minutes). The test was conducted until 2000 hours. After that, the mechanical characteristics after the long-term test was evaluated by the above-mentioned test method for mechanical characteristics.

Evaluating Standards

*: Retention rate for tensile elongation was 65% or more
○○: Retention rate for tensile elongation was 60% or more
○: Retention rate for tensile elongation was 50% or more
Δ: Retention rate for tensile elongation was 40% or more
x: Retention rate for tensile elongation was less than 40%

<Preparation Example of Polyester Resin (A)>

Into a reactor equipped with a stirrer, thermometer and cooler for distillate were added 166 parts by mass of terephthalic acid, 180 parts by mass of 1,4-butanediol and 0.25 part by mass of tetrabutyl titanate (a catalyst) and an esterification reaction was conducted at 170 to 220° C. for two hours. After completion of the esterification reaction, 300 parts by mass of PTMG 1000 (polytetramethylene glycol manufactured by Mitsubishi Chemical having the number-average molecular weight of 1000) and 0.5 part by mass of Irganox 1330 (a hindered phenol-type antioxidant manufactured by Ciba-Geigy) were added thereto followed by heating up to 255° C. while the system was gradually vacuated during 60 minutes to reduce to 665 Pa at 255° C. Then, polycondensation reaction was further conducted for 30 minutes under 133 Pa or lower to give a polyester resin (A-1). The melt viscosity, melting point, glass transition temperature and acid value of this polyester resin (A-1) are shown in Table 1. In addition, a polyester resin (A-2) and a polyester resin (A-3) were also synthesized by the same method as for the polyester resin (A-1). Compositions and physical property values thereof are shown in Table 1.

TABLE 1

| Polyester resin (A) | | | A-1 | A-2 | A-3 |
|---|---|---|---|---|---|
| Composition molar % | dicarboxylic acid component | TPA | 100 | | |
| | | NDC | | 100 | 100 |
| | diol component | BD | 72 | 60 | 58 |
| | | PTMG1000 | 28 | 40 | |
| | | PTMG2000 | | | 42 |
| Physical property | melt viscosity dPa · s | | 250 | 400 | 400 |
| | melting point ° C. | | 165 | 185 | 159 |
| | glass transition temperature ° C. | | −65 | −70 | −75 |
| | acid value eq/t | | 40 | 30 | 30 |

Abbreviations in the tables are as follows.

TPA: terephthalic acid; NDC: 2,6-naphthalene-dicarboxylic acid; BD: 1,4-butanediol; PTMG 1000: polytetramethylene ether glycol (number-average molecular weight: 1000); PTMG 2000: polytetramethylene ether glycol (number-average molecular weight: 2000)

The polyester resin (A), the carbodiimide (B), the antioxidant (C), the epoxy (D), the polyolefin (E) and the terpene-modified phenol resin (F) in a ratio as shown in Tables 2 and 3 were melted and kneaded at a die temperature of 160 to 200° C. using a biaxial extruder to give the sealing resin compositions. Long-period durability of the sealing resin composition or, particularly, the shear bond strength characteristics and the retention rate for tensile elongation up to 2000 hours under the atmosphere of 105° C., the atmosphere of 85° C. temperature and 85% relative humidity or the atmosphere of reciprocation between −40° C. and 105° C. were evaluated. Results of the evaluations are as shown in the following Tables 2 and 3.

TABLE 2

| | Example Resin composition | | Example 1 composition 1 | Example 2 composition 2 | Example 3 composition 3 | Example 4 composition 4 |
|---|---|---|---|---|---|---|
| Composition (part(s) by mass) | polyester (A) | polyester (A-1) | 100 | 100 | 100 | 100 |
| | | polyester (A-2) | | | | |
| | | polyester (A-3) | | | | |
| | carbodiimide (B) | carbodiimide (B-1) | 1 | 1 | 1 | |
| | | carbodiimide (B-2) | | | | 1 |
| | antioxidant (C) | antioxidant (C-1) | 0.5 | | 0.5 | 0.5 |
| | | antioxidant (C-2) | | 0.5 | 0.5 | 0.5 |
| | epoxy (D) | epoxy (D-1) | | | | |
| | polyolefin (E) | polyolefin (E-1) | | | | |
| | | polyolefin (E-2) | | | | |
| | terpene-modified phenol resin (F) | terpene-modified phenol resin (F-1) | | | | |
| | | terpene-modified phenol resin (F-2) | | | | |
| | | terpene-modified phenol resin (F-3) | | | | |
| Characteristics | GE without resist shear bond strength (MPa) | initial stage | 1.1 ○ | 1.1 ○ | 1.1 ○ | 1.1 ○ |
| | | 105° C. × 2000 hours | 1.2 ○ | 1.2 ○ | 1.2 ○ | 1.2 ○ |
| | | 85° C. 85% RH × 2000 hours | 1.1 ○ | 1.1 ○ | 1.1 ○ | 1.1 ○ |

TABLE 2-continued

| | | | | | | |
|---|---|---|---|---|---|---|
| | | between −40° C. and 105° C. (retention time at each temperature: 30 minutes; cycle frequency: 2000 times) | 1.2 ○ | 1.2 ○ | 1.2 ○ | 1.2 ○ |
| | PBT shear bond strength (MPa) | initial stage | 1.1 ○ | 1.1 ○ | 1.1 ○ | 1.1 ○ |
| | | 105° C. × 2000 hours | 1.2 ○ | 1.2 ○ | 1.2 ○ | 1.2 ○ |
| | | 85° C. 85% RH × 2000 hours | 1.1 ○ | 1.1 ○ | 1.1 ○ | 1.1 ○ |
| | | between −40° C. and 105° C. (retention time at each temperature: 30 minutes; cycle frequency: 2000 times) | 1.2 ○ | 1.2 ○ | 1.2 ○ | 1.2 ○ |
| | retention rate for tensile elongation (%) | 105° C. × 2000 hours | 52 ○ | 52 ○ | 58 ○ | 55 ○ |
| | | 85° C. 85% RH × 2000 hours | 51 ○ | 50 ○ | 57 ○ | 54 ○ |
| | | between −40° C. and 105° C. (retention time at each temperature: 30 minutes; cycle frequency: 2000 times) | 53 ○ | 52 ○ | 59 ○ | 57 ○ |

| | Example Resin composition | | Example 5 composition 5 | Example 6 composition 6 | Example 7 composition 7 | Example 8 composition 8 |
|---|---|---|---|---|---|---|
| Composition (part(s) by mass) | polyester (A) | polyester (A-1) | | | 100 | 100 |
| | | polyester (A-2) | 100 | | | |
| | | polyester (A-3) | | 100 | | |
| | carbodiimide (B) | carbodiimide (B-1) | 1 | 1 | 1 | 1 |
| | | carbodiimide (B-2) | | | | |
| | antioxidant (C) | antioxidant (C-1) | 0.5 | 0.5 | 0.5 | 0.5 |
| | | antioxidant (C-2) | 0.5 | 0.5 | 0.5 | 0.5 |
| | epoxy (D) | epoxy (D-1) | | | 20 | 20 |
| | polyolefin (E) | polyolefin (E-1) | | | | 40 |
| | | polyolefin (E-2) | | | | |
| | terpene-modified phenol resin (F) | terpene-modified phenol resin (F-1) | | | | |
| | | terpene-modified phenol resin (F-2) | | | | |
| | | terpene-modified phenol resin (F-3) | | | | |
| Characteristics | GE without resist shear bond strength (MPa) | initial stage | 1.1 ○ | 1.0 ○ | 1.5 ○ | 2.0 ○○ |
| | | 105° C. × 2000 hours | 1.1 ○ | 1.0 ○ | 2.3 ○○ | 2.3 ○○ |
| | | 85° C. 85% RH × 2000 hours | 1.0 ○ | 1.0 ○ | 2.0 ○○ | 2.0 ○○ |
| | | between −40° C. and 105° C. (retention time at each temperature: 30 minutes; cycle frequency: 2000 times) | 1.1 ○ | 1.0 ○ | 1.2 ○ | 2.3 ○○ |
| | PBT shear bond strength (MPa) | initial stage | 1.0 ○ | 1.0 ○ | 2.0 ○○ | 2.0 ○○ |
| | | 105° C. × 2000 hours | 1.1 ○ | 1.0 ○ | 2.3 ○○ | 2.3 ○○ |
| | | 85° C. 85% RH × 2000 hours | 1.0 ○ | 1.0 ○ | 2.0 ○○ | 2.0 ○○ |
| | | between −40° C. and 105° C. (retention time at each temperature: 30 minutes; cycle frequency: 2000 times) | 1.1 ○ | 1.0 ○ | 1.2 ○ | 2.3 ○○ |
| | retention rate for tensile elongation (%) | 105° C. × 2000 hours | 58 ○ | 58 ○ | 55 ○ | 61 ○○ |
| | | 85° C. 85% RH × 2000 hours | 55 ○ | 55 ○ | 52 ○ | 60 ○○ |
| | | between −40° C. and 105° C. (retention time at each temperature: 30 minutes; cycle frequency: 2000 times) | 56 ○ | 56 ○ | 55 ○ | 62 ○○ |

TABLE 2-continued

| | Example<br>Resin composition | | Example 9<br>composition 9 | Example 10<br>composition 10 | Example 11<br>composition 11 | Example 12<br>composition 12 |
|---|---|---|---|---|---|---|
| Composition<br>(part(s) by mass) | polyester (A) | polyester (A-1) | 100 | 100 | 100 | 100 |
| | | polyester (A-2) | | | | |
| | | polyester (A-3) | | | | |
| | carbodiimide (B) | carbodiimide (B-1) | 1 | 1 | 1 | 1 |
| | | carbodiimide (B-2) | | | | |
| | antioxidant (C) | antioxidant (C-1) | 0.5 | 0.5 | 0.5 | 0.5 |
| | | antioxidant (C-2) | 0.5 | 0.5 | 0.5 | 0.5 |
| | epoxy (D) | epoxy (D-1) | 20 | 5 | 5 | 5 |
| | polyolefin (E) | polyolefin (E-1) | | 40 | 40 | 40 |
| | | polyolefin (E-2) | 40 | | | |
| | terpene-modified<br>phenol resin (F) | terpene-modified phenol resin (F-1) | | 40 | | |
| | | terpene-modified phenol resin (F-2) | | | 40 | |
| | | terpene-modified phenol resin (F-3) | | | | 40 |
| Characteristics | GE without resist<br>shear bond strength<br>(MPa) | initial stage | 2.0<br>○○ | 3.0<br>★ | 3.0<br>★ | 3.5<br>★ |
| | | 105° C. × 2000 hours | 2.3<br>○○ | 3.2<br>★ | 3.5<br>★ | 3.5<br>★ |
| | | 85° C. 85% RH × 2000 hours | 2.0<br>○○ | 3.0<br>★ | 3.0<br>★ | 3.5<br>★ |
| | | between −40° C. and 105° C.<br>(retention time at each<br>temperature: 30 minutes;<br>cycle frequency: 2000 times) | 2.3<br>○○ | 3.2<br>★ | 3.0<br>★ | 3.5<br>★ |
| | PBT<br>shear bond strength<br>(MPa) | initial stage | 2.0<br>○○ | 3.0<br>★ | 3.0<br>★ | 3.5<br>★ |
| | | 105° C. × 2000 hours | 2.3<br>○○ | 3.2<br>★ | 3.5<br>★ | 3.5<br>★ |
| | | 85° C. 85% RH × 2000 hours | 2.0<br>○○ | 3.0<br>★ | 3.0<br>★ | 3.5<br>★ |
| | | between −40° C. and 105° C.<br>(retention time at each<br>temperature: 30 minutes;<br>cycle frequency: 2000 times) | 2.3<br>○○ | 3.2<br>★ | 3.5<br>★ | 3.5<br>★ |
| | retention rate for tensile<br>elongation (%) | 105° C. × 2000 hours | 62<br>○○ | 62<br>○○ | 63<br>○○ | 65<br>★ |
| | | 85° C. 85% RH × 2000 hours | 60<br>○○ | 60<br>○○ | 61<br>○○ | 65<br>★ |
| | | between −40° C. and 105° C.<br>(retention time at each<br>temperature: 30 minutes;<br>cycle frequency: 2000 times) | 61<br>○○ | 62<br>○○ | 62<br>○○ | 62<br>○○ |

| | Example<br>Resin composition | | Example 13<br>composition 13 | Example 14<br>composition 14 | Example 15<br>composition 15 | Example 16<br>composition 16 |
|---|---|---|---|---|---|---|
| Composition<br>(part(s) by mass) | polyester (A) | polyester (A-1) | 100 | 100 | 100 | 100 |
| | | polyester (A-2) | | | | |
| | | polyester (A-3) | | | | |
| | carbodiimide (B) | carbodiimide (B-1) | 1 | 1 | 1 | 0.2 |
| | | carbodiimide (B-2) | | | | |
| | antioxidant (C) | antioxidant (C-1) | 0.5 | 0.5 | 0.5 | 0.5 |
| | | antioxidant (C-2) | 0.5 | | | |
| | epoxy (D) | epoxy (D-1) | 5 | | | |
| | polyolefin (E) | polyolefin (E-1) | 45 | 40 | | |
| | | polyolefin (E-2) | | | | |
| | terpene-modified<br>phenol resin (F) | terpene-modified phenol resin (F-1) | | | 40 | |
| | | terpene-modified phenol resin (F-2) | | | | |
| | | terpene-modified phenol resin (F-3) | 45 | | | |
| Characteristics | GE without resist<br>shear bond strength<br>(MPa) | initial stage | 3.5<br>★ | 1.2<br>○ | 2.3<br>○○ | 1.2<br>○ |
| | | 105° C. × 2000 hours | 4.0<br>★ | 1.2<br>○ | 2.5<br>○○ | 1.2<br>○ |
| | | 85° C. 85% RH × 2000 hours | 3.5<br>★ | 1.0<br>○ | 1.0<br>○○ | 2.1<br>○ |
| | | between −40° C. and 105° C.<br>(retention time at each<br>temperature: 30 minutes;<br>cycle frequency: 2000 times) | 4.0<br>★ | 1.2<br>○ | 2.4<br>○○ | 1.2<br>○ |

TABLE 2-continued

| | | | | | | |
|---|---|---|---|---|---|---|
| | PBT shear bond strength (MPa) | initial stage | 3.5 ★ | 1.2 ○ | 2.0 ○○ | 1.0 ○ |
| | | 105° C. × 2000 hours | 4.0 ★ | 1.2 ○ | 2.3 ○○ | 1.2 ○ |
| | | 85° C. 85% RH × 2000 hours | 3.5 ★ | 1.1 ○ | 1.9 ○ | 1.0 ○ |
| | | between −40° C. and 105° C. (retention time at each temperature: 30 minutes; cycle frequency: 2000 times) | 4.0 ★ | 1.2 ○ | 2.1 ○○ | 1.1 ○ |
| | retention rate for tensile elongation (%) | 105° C. × 2000 hours | 70 ★ | 59 ○ | 52 ○ | 55 ○ |
| | | 85° C. 85% RH × 2000 hours | 70 ★ | 56 ○ | 51 ○ | 51 ○ |
| | | between −40° C. and 105° C. (retention time at each temperature: 30 minutes; cycle frequency: 2000 times) | 70 ★ | 59 ○ | 57 ○ | 55 ○ |

| | | | Example Resin composition | Example 17 composition 17 | Example 18 composition 18 |
|---|---|---|---|---|---|
| Composition (part(s) by mass) | polyester (A) | polyester (A-1) | | 100 | 100 |
| | | polyester (A-2) | | | |
| | | polyester (A-3) | | | |
| | carbodiimide (B) | carbodiimide (B-1) | | 5 | 1 |
| | | carbodiimide (B-2) | | | |
| | antioxidant (C) | antioxidant (C-1) | | 0.5 | 3 |
| | | antioxidant (C-2) | | | |
| | epoxy (D) | epoxy (D-1) | | | |
| | polyolefin (E) | polyolefin (E-1) | | | |
| | | polyolefin (E-2) | | | |
| | terpene-modified phenol resin (F) | terpene-modified phenol resin (F-1) | | | |
| | | terpene-modified phenol resin (F-2) | | | |
| | | terpene-modified phenol resin (F-3) | | | |
| Characteristics | GE without resist shear bond strength (MPa) | initial stage | | 1.2 ○ | 1.1 ○ |
| | | 105° C. × 2000 hours | | 1.2 ○ | 1.2 ○ |
| | | 85° C. 85% RH × 2000 hours | | 1.2 ○ | 1.1 ○ |
| | | between −40° C. and 105° C. (retention time at each temperature: 30 minutes; cycle frequency: 2000 times) | | 1.2 ○ | 1.2 ○ |
| | PBT shear bond strength (MPa) | initial stage | | 1.0 ○ | 1.1 ○ |
| | | 105° C. × 2000 hours | | 1.2 ○ | 1.2 ○ |
| | | 85° C. 85% RH × 2000 hours | | 1.0 ○ | 1.1 ○ |
| | | between −40° C. and 105° C. (retention time at each temperature: 30 minutes; cycle frequency: 2000 times) | | 1.2 ○ | 1.2 ○ |
| | retention rate for tensile elongation (%) | 105° C. × 2000 hours | | 64 ○○ | 57 ○ |
| | | 85° C. 85% RH × 2000 hours | | 60 ○○ | 56 ○ |
| | | between −40° C. and 105° C. (retention time at each temperature: 30 minutes; cycle frequency: 2000 times) | | 69 ○○ | 58 ○ |

TABLE 3

| | Comparative Example<br>Resin composition | | Comparative Example 1<br>composition 19 | Comparative Example 2<br>composition 20 | Comparative Example 3<br>composition 21 | Comparative Example 4<br>composition 22 |
|---|---|---|---|---|---|---|
| Composition (part(s) by mass) | polyester (A) | polyester (A-1) | 100 | 100 | 100 | 100 |
| | | polyester (A-2) | | | | |
| | | polyester (A-3) | | | | |
| | carbodiimide (B) | carbodiimide (B-1) | | 1 | | 1 |
| | | carbodiimide (B-2) | | | | |
| | antioxidant (C) | antioxidant (C-1) | 0.5 | | 0.5 | |
| | | antioxidant (C-2) | | | 0.5 | |
| | epoxy (D) | epoxy (D-1) | | | 20 | 20 |
| | polyolefin (E) | polyolefin (E-1) | | | | |
| | | polyolefin (E-2) | | | | |
| | terpene-modified phenol resin (F) | terpene-modified phenol resin (F-1) | | | | |
| | | terpene-modified phenol resin (F-2) | | | | |
| | | terpene-modified phenol resin (F-3) | | | | |
| Characteristics | GE without resist shear bond strength (MPa) | initial stage | 1.0<br>○ | 1.0<br>○ | 2.0<br>○○ | 2.0<br>○○ |
| | | 105° C. × 2000 hours | 1.2<br>○ | 1.2<br>○ | 2.2<br>○○ | 2.2<br>○○ |
| | | 85° C. 85% RH × 2000 hours | 0.4<br>x | 0.6<br>Δ | 0.8<br>Δ | 2.0<br>○○ |
| | | between −40° C. and 105° C. (retention time at each temperature: 30 minutes; cycle frequency: 2000 times) | 1.2<br>○ | 1.2<br>○ | 1.5<br>○ | 1.4<br>○ |
| | PBT shear bond strength (MPa) | initial stage | 1.2<br>○ | 1.2<br>○ | 1.8<br>○ | 1.9<br>○ |
| | | 105° C. × 2000 hours | 1.2<br>○ | 1.2<br>○ | 2.1<br>○○ | 2.2<br>○○ |
| | | 85° C. 85% RH × 2000 hours | 0.4<br>x | 0.5<br>Δ | 0.8<br>Δ | 2.0<br>○○ |
| | | between −40° C. and 105° C. (retention time at each temperature: 30 minutes; cycle frequency: 2000 times) | 1.2<br>○ | 1.2<br>○ | 1.1<br>○ | 1.2<br>○ |
| | retention rate for tensile elongation (%) | 105° C. × 2000 hours | 52<br>○ | 38<br>x | 62<br>○○ | 38<br>x |
| | | 85° C. 85% RH × 2000 hours | 24<br>x | 50<br>○ | 37<br>x | 53<br>○ |
| | | between −40° C. and 105° C. (retention time at each temperature: 30 minutes; cycle frequency: 2000 times) | 53<br>○ | 55<br>○ | 52<br>○ | 48<br>Δ |

| | Comparative Example<br>Resin composition | | Comparative Example 5<br>composition 23 | Comparative Example 6<br>composition 24 | Comparative Example 7<br>composition 25 | Comparative Example 8<br>composition 26 |
|---|---|---|---|---|---|---|
| Composition (part(s) by mass) | polyester (A) | polyester (A-1) | 100 | 100 | 100 | 100 |
| | | polyester (A-2) | | | | |
| | | polyester (A-3) | | | | |
| | carbodiimide (B) | carbodiimide (B-1) | | 1 | | 1 |
| | | carbodiimide (B-2) | | | | |
| | antioxidant (C) | antioxidant (C-1) | 0.5 | | 0.5 | |
| | | antioxidant (C-2) | 0.5 | | 0.5 | |
| | epoxy (D) | epoxy (D-1) | 20 | 20 | 5 | 5 |
| | polyolefin (E) | polyolefin (E-1) | 40 | 40 | 45 | 45 |
| | | polyolefin (E-2) | | | | |
| | terpene-modified phenol resin (F) | terpene-modified phenol resin (F-1) | | | 45 | 45 |
| | | terpene-modified phenol resin (F-2) | | | | |
| | | terpene-modified phenol resin (F-3) | | | | |
| Characteristics | GE without resist shear bond strength (MPa) | initial stage | 2.2<br>○○ | 2.0<br>○○ | 3.0<br>★ | 3.0<br>★ |
| | | 105° C. × 2000 hours | 2.5<br>○○ | 2.2<br>○○ | 3.2<br>★ | 3.2<br>★ |
| | | 85° C. 85% RH × 2000 hours | 0.8<br>Δ | 2.0<br>○○ | 1.6<br>○ | 2.0<br>○○ |
| | | between −40° C. and 105° C. (retention time at each temperature: 30 minutes; cycle frequency: 2000 times) | 3.5<br>★ | 2.3<br>○○ | 3.2<br>★ | 2.3<br>○○ |
| | PBT shear bond strength (MPa) | initial stage | 2.2<br>○○ | 2.3<br>○○ | 2.1<br>○○ | 2.3<br>○○ |
| | | 105° C. × 2000 hours | 2.4<br>○○ | 2.3<br>○○ | 2.4<br>○○ | 2.3<br>○○ |
| | | 85° C. 85% RH × 2000 hours | 0.8<br>Δ | 2.3<br>○○ | 1.7<br>○ | 2.3<br>○○ |
| | | between −40° C. and 105° C. (retention time at each temperature: 30 minutes; cycle frequency: 2000 times) | 2.3<br>○○ | 2.2<br>○○ | 2.3<br>○○ | 2.2<br>○○ |

TABLE 3-continued

| | | | | | |
|---|---|---|---|---|---|
| retention rate for tensile elongation (%) | 105° C. × 2000 hours | 53 ○ | 37 x | 58 ○ | 36 x |
| | 85° C. 85% RH × 2000 hours | 33 x | 64 ○○ | 24 x | 64 ○○ |
| | between −40° C. and 105° C. (retention time at each temperature: 30 minutes; cycle frequency: 2000 times) | 49 Δ | 58 ○ | 45 Δ | 53 ○ |

The carbodiimide (B), the antioxidant (C), the epoxy (D), the polyolefin (E) and the terpene-modified phenol resin (F) used in Tables 2 and 3 are as follows.

Carbodiimide (B-1): Carbodilite (Registered Trademark) HMV-15CA manufactured by Nisshinbo Chemicals Carbodiimide (B-2): Carbodilite (Registered Trademark) LA-1 manufactured by Nisshinbo Chemicals Antioxidant (C-1): Hindered phenol-type antioxidant, IRGANOX 1010 (Registered Trademark), manufactured by BASF Japan Antioxidant (C-2): Thioether-type antioxidant, LasmitLG (Registered Trademark), manufactured by Daiichi Kogyo Seiyaku, dodecyl 3,3'-thio-dipropionate Epoxy (D-1): JER 1007 (Registered Trademark) manufactured by Mitsubishi Chemical Polyolefin (E-1): Excellen (Registered Trademark) VL EUL 731, manufactured by Sumitomo Chemical, ethylene-α-olefin copolymer, density: 0.90, MFR: 10 g/10 minutes Polyolefin (E-2): Admer (Registered Trademark) SF-600, manufactured by Mitsui Chemical, adhesive polyolefin, density: 0.88, MFR: 3.3 g/10 minutes Terpene-modified phenol resin (F-1): YS Polystar K 140 (Registered Trademark), manufactured by Yasuhara Chemical Terpene-modified phenol resin (F-2): YS Polystar G 150 (Registered Trademark), manufactured by Yasuhara Chemical Terpene-modified phenol resin (F-3): YS Polystar T 160 (Registered Trademark), manufactured by Yasuhara Chemical Industrial Applicability The sealing resin composition of the present invention has a low melt viscosity in the sealing of electrical/electronic substrate plate, is very excellent in the adhesive strength to a glass epoxy substrate plate and a PBT substrate plate and is excellent in a long-term reliability. Accordingly, it is useful as a sealing resin composition for electrical/electronic parts. In addition, the sealed body of electrical/electronic parts according to the present invention is excellent particularly in terms of the adhesive property and the long-term reliability and, therefore, electric leakage from the electrical/electronic parts is suppressed whereby the product is very useful. The sealed body of electrical/electronic parts according to the present invention is useful as a molded product of various connectors and harnesses for automobiles, communications, computers and home electric appliances or switches and sensors having electronic parts and printed boards.

The invention claimed is:

1. A sealing resin composition containing a polyester resin (A), carbodiimide (B) an antioxidant (C), and polyolefin (E), wherein glass transition temperature of the polyester resin (A) is −100° C. to −10° C., and wherein the polyolefin (E) is a binarily or more highly copolymerized polyolefin having density of 0.75 g/cm$^3$ or more and 0.91 g/cm$^3$ or less,
   wherein the resin composition further contains epoxy (D), and
   wherein the resin composition further contains a terpene-modified phenol resin (F).

2. The sealing resin composition according to claim 1, wherein acid value of the polyester resin (A) is 100 equivalents/10$^6$ g or less.

3. A sealed body which is sealed by the sealing resin composition mentioned in claim 1.

\* \* \* \* \*